United States Patent
Feng et al.

(10) Patent No.: US 11,728,726 B2
(45) Date of Patent: Aug. 15, 2023

(54) FREQUENCY MODULATION DEVICE, SWITCHING POWER SUPPLY AND FREQUENCY MODULATION METHOD THEREOF

(71) Applicant: GREE ELECTRIC APPLIANCES, INC. OF ZHUHAI, Qianshan Zhuhai (CN)

(72) Inventors: Yuming Feng, Zhuhai (CN); Huiping Yin, Zhuhai (CN); Yuhua Xie, Zhuhai (CN); Liang Zhang, Zhuhai (CN); Suibiao Huang, Zhuhai (CN); Xinchao Peng, Zhuhai (CN); Yijun Xu, Zhuhai (CN); Jing Wang, Zhuhai (CN)

(73) Assignee: GREE ELECTRIC APPLIANCES, INC. OF ZHUHAI, Zhuhai (CN)

( * ) Notice: Subject to any disclaimer, the term of this patent is extended or adjusted under 35 U.S.C. 154(b) by 267 days.

(21) Appl. No.: 17/278,192

(22) PCT Filed: Sep. 30, 2019

(86) PCT No.: PCT/CN2019/109275
§ 371 (c)(1),
(2) Date: Mar. 19, 2021

(87) PCT Pub. No.: WO2020/078209
PCT Pub. Date: Apr. 23, 2020

(65) Prior Publication Data
US 2022/0037996 A1      Feb. 3, 2022

(30) Foreign Application Priority Data

Oct. 19, 2018 (CN) .......................... 201811223781.5

(51) Int. Cl.
*H02M 1/44* (2007.01)
*H02M 1/36* (2007.01)
(Continued)

(52) U.S. Cl.
CPC ............... *H02M 1/44* (2013.01); *H02M 1/36* (2013.01); *H02M 3/158* (2013.01); *H02M 3/156* (2013.01); *H03K 3/0231* (2013.01); *H03K 7/06* (2013.01)

(58) Field of Classification Search
None
See application file for complete search history.

(56) References Cited

U.S. PATENT DOCUMENTS

| | | | | |
|---|---|---|---|---|
| 7,489,529 B2 * | 2/2009 | Yang | .................... | H02M 3/1563 363/39 |
| 7,561,002 B1 * | 7/2009 | Hariton | ..................... | H03K 7/08 332/119 |
| 8,085,106 B2 * | 12/2011 | Huda | ....................... | H03K 3/84 332/123 |
| 10,686,375 B1 * | 6/2020 | Davis-Marsh | ......... | G01R 19/02 |

(Continued)

FOREIGN PATENT DOCUMENTS

| | | | |
|---|---|---|---|
| CN | 101562442 | A | 10/2009 |
| CN | 102064682 | A | 5/2011 |

(Continued)

OTHER PUBLICATIONS

International Search Report dated Dec. 27, 2019, issued in corresponding International Application No. PCT/CN2019/109275, filed Sep. 30, 2019, 4 pages.

*Primary Examiner* — Matthew V Nguyen
(74) *Attorney, Agent, or Firm* — Christensen O'Connor Johnson Kindness PLLC

(57) ABSTRACT

The present disclosure relates to a frequency modulation device, a switching power supply and a frequency modulation method thereof. The device includes: a waveform generation unit (10) configured to generate a periodic signal required for performing frequency modulation on a clock signal of a switching power supply to be controlled; a frequency modulation unit (20) configured to perform voltage-current conversion and arithmetic processing based on the periodic signal to obtain a frequency modulation current (Continued)

required for performing the frequency modulation on the clock signal of the switching power supply to be controlled; and an RC oscillation unit (30) configured to perform RC oscillation processing based on the frequency modulation current to obtain a frequency oscillation signal as the clock signal of the switching power supply to be controlled.

14 Claims, 7 Drawing Sheets

(51) Int. Cl.
*H02M 3/158* (2006.01)
*H03K 7/06* (2006.01)
*H03K 3/0231* (2006.01)
*H02M 3/156* (2006.01)

(56) References Cited

U.S. PATENT DOCUMENTS

| | | |
|---|---|---|
| 2016/0359418 A1 | 12/2016 | Kawashima |
| 2017/0033707 A1* | 2/2017 | Nishijima ............... H02M 1/36 |
| 2017/0099004 A1* | 4/2017 | Nishijima ............... H02M 1/08 |
| 2021/0091758 A1* | 3/2021 | Gonzalez Jimenez ..................... H03L 7/0812 |

FOREIGN PATENT DOCUMENTS

| | | |
|---|---|---|
| CN | 102790601 A | 11/2012 |
| CN | 103166459 A | 6/2013 |
| CN | 204103766 U | 1/2015 |
| CN | 204578356 U | 8/2015 |
| CN | 206180830 U | 5/2017 |
| CN | 109088538 A | 12/2018 |
| WO | WO-2019181201 A1 * | 9/2019 ............ B60L 50/66 |

* cited by examiner

FREQUENCY MODULATION DEVICE, SWITCHING POWER SUPPLY AND FREQUENCY MODULATION METHOD THEREOF

CROSS REFERENCE TO RELATED APPLICATION

The present application claims priority to Chinese Patent Application No. 201811223781.5, entitled "Frequency Modulation Device, Switching Power Supply and Frequency Modulation Method Thereof", filed on Oct. 19, 2018, the content of which is expressly incorporated herein by reference in its entirety.

TECHNICAL FIELD

The present disclosure relates to the field of switching power supply technology, and specifically relates to a frequency modulation device, a switching power supply and a frequency modulation method thereof, and more particularly to a device for implementing a brand-new frequency modulation technology, a switching power supply having the device and a frequency modulation method thereof.

BACKGROUND

In the development of the integrated circuit industry, switching power supply systems are more and more widely used. At the same time, the interference performance of the switching power supply system itself to the outside world (i.e., Electro Magnetic Compatibility (EMC)) will be subject to more and more stringent requirements and restrictions. In the principle of switching power supply, an oscillator module is needed. The output frequency of the oscillator known to the inventors is a fixed frequency.

SUMMARY

For the above-mentioned defects, the purpose of the present disclosure is to provide a frequency modulation device, a switching power supply and a frequency modulation method thereof, to address the problem of low EMC performance of the switching power supply with a fixed-frequency oscillator and achieve the effect of improving the EMC performance.

The present disclosure provides a frequency modulation device, including: a waveform generation unit configured to generate a periodic signal required for performing frequency modulation on a clock signal of a switching power supply to be controlled; a frequency modulation unit configured to perform voltage-current conversion and arithmetic processing based on the periodic signal to obtain a frequency modulation current required for performing the frequency modulation on the clock signal of the switching power supply to be controlled; and an RC oscillation unit configured to perform RC oscillation processing based on the frequency modulation current to obtain a frequency oscillation signal as the clock signal of the switching power supply to be controlled.

In some embodiments, the waveform generation unit is further configured to generate a reference signal for comparison with the periodic signal; the frequency modulation unit is configured to perform the voltage-current conversion and arithmetic processing based on the periodic signal, and is specifically configured to perform the voltage-current conversion and arithmetic processing based on the periodic signal and the reference signal.

In some embodiments, the frequency modulation unit includes a voltage-current conversion module and an arithmetic module; the voltage-current conversion module includes: a first current mirror, a second current mirror, and a third current mirror; the second current mirror is respectively connected to the first current mirror and the third current mirror; the third current mirror is further connected to the RC oscillation unit; the calculation module includes a reference module and a control module; the reference module and the control module are respectively connected to the waveform generation unit, the first current mirror and the third current mirror.

In some embodiments, the first current mirror includes a first MOS transistor and a second MOS transistor; the second current mirror includes a third MOS transistor and a fourth MOS transistor; the third current mirror includes a fifth MOS transistor and a sixth MOS transistor; a gate and a drain of the first MOS transistor, a gate and a drain of the second MOS transistor, a gate and a drain of the third MOS transistor, a gate of the fourth MOS transistor, a source of the fifth MOS transistor, and a source of the fifth MOS transistor are connected; a source of the first MOS transistor is connected to the reference module, a source of the second MOS transistor is connected to the control module; a drain of the fourth MOS transistor, a drain and a gate of the fifth MOS transistor, and a gate of the sixth MOS transistor are connected; the source of the sixth MOS transistor is connected to the RC oscillation unit.

In some embodiments, in the first current mirror, the first MOS transistor, the second MOS transistor, the third MOS transistor, and the fourth MOS transistor are all NMOS transistors. In the third current mirror, both the fifth MOS transistor and the sixth MOS transistor are PMOS transistors; and/or the second current mirror includes a scaling current mirror.

In some embodiments, the reference module includes a seventh MOS transistor or a sampling resistor; the control module includes an eighth MOS transistor; if the reference module includes a seventh MOS transistor, a gate of the seventh MOS transistor is connected to a reference signal output terminal of the waveform generation unit, and a drain of the seventh MOS transistor is connected to the first current mirror; if the reference module includes a sampling resistor, the sampling resistor is connected to the first current mirror; a gate of the eighth MOS transistor is connected to the periodic signal output terminal of the waveform generation unit, and a drain of the eighth MOS transistor is connected to the first current mirror.

In some embodiments, the seventh MOS transistor and the eighth MOS transistor are both NMOS transistors.

In some embodiments, the waveform generation unit includes a signal generation circuit of any one of a triangular wave signal, a sine oscillation signal, a cosine oscillation signal, and a square wave oscillation signal.

In some embodiments, the RC oscillation unit includes an RC oscillator.

In another aspect of the present disclosure, a switching power supply is provided, which includes the above-mentioned frequency modulation device.

In another aspect of the present disclosure, a frequency modulation method for a switching power supply is provided, which includes: generating, by a waveform generation unit, a periodic signal required for performing frequency modulation on a clock signal of the switching power supply to be controlled; performing, by a frequency modulation unit, voltage-current conversion and arithmetic processing based on the periodic signal to obtain a frequency modulation current required for performing the frequency modulation on the clock signal of the switching power supply to be controlled; and performing, by an RC oscillation unit, RC oscillation processing based on the frequency modulation current to obtain a frequency oscillation signal as the clock signal of the switching power supply to be controlled.

In the solution of the present disclosure, the frequency modulation is implemented based on an RC oscillator known to the inventors in an integrated circuit, which can stably implement the switching frequency modulation of the chip and greatly optimize the EMC performance of the switching power supply; furthermore, the modulation mode is simple and flexible.

Further, in the solution of the present disclosure, the periodic signal is converted into the frequency modulation current to input into the oscillator by the voltage-current conversion and arithmetic circuit, which can implement the switching frequency modulation of the chip and improve the EMC performance of the switching power supply; furthermore, the reliability is high and the safety is good.

Furthermore, in the solution of the present disclosure, periodic signals of different waveforms are converted into the frequency modulation current to input into the oscillator by the voltage-current conversion and arithmetic circuit, which can be applied to a variety of occasions that require the frequency modulation, and the frequency modulation has a good flexibility and a high reliability.

Therefore, in the solution of the present disclosure, the periodic signal is converted into the frequency modulation current to input into the oscillator by the voltage-current conversion and arithmetic circuit, which implements the modulation of the output frequency of the oscillator, and solves the problem of low EMC performance of the switching power supply with a fixed-frequency oscillator in the related art. Therefore, the defects of low EMC performance, low reliability and low safety in the related art are overcome, and advantages of good EMC performance, high reliability and good safety are achieved.

With reference to the drawings, reference signs in the embodiments of the present disclosure are provided as follows:

10, waveform generation unit; 20, frequency modulation unit; 30, RC oscillator unit (such as an RC oscillator known to the inventors or an IRC oscillator known to the inventors).

DETAILED DESCRIPTION

In order to make the purposes, technical solutions, and advantages of the present disclosure clearer, the present disclosure will be further detailed below through the embodiments in conjunction with the accompanying drawings. It should be understood that the specific embodiments described here are merely used for explaining the disclosure, rather than limiting the disclosure.

Figure 1:
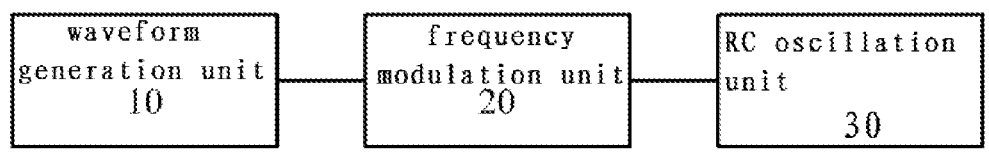
FIG. 1 is a schematic structure diagram of a frequency modulation device according to some embodiments of the present disclosure.

According to some embodiments of the present disclosure, a frequency modulation device is provided. Referring to FIG. 1, which is a schematic structure diagram of a frequency modulation device according to some embodiments of the present disclosure. The frequency modulation device includes a waveform generation unit 10, a frequency modulation unit 20, and an RC oscillation unit 30; the waveform generation unit 10, the frequency modulation unit 20, and the RC oscillation unit 30 are sequentially connected.

In some optional examples, the waveform generation unit 10 is configured to generate a periodic signal required for performing frequency modulation on a clock signal of the switching power supply to be controlled, that is, to generate a periodic signal required for performing the frequency modulation on the switching power supply to be modulated in frequency.

In some optional examples, the waveform generating unit 10 includes a signal generation circuit for generating any one of a triangular wave signal, a sine oscillation signal, a cosine oscillation signal, and a square wave oscillation signal.

For example, the waveform generating unit is configured to generate a triangular wave signal which oscillates periodically. In fact, a unit generating sine oscillation signals, cosine oscillation signals, square wave oscillation signals, and various other periodic oscillation signals can implement the frequency modulation function.

Therefore, the required periodic signal is generated by the signal generation circuit based on a variety of periodic oscillation signals, so that the frequency modulation device has a wide application range, and the frequency modulation has a good flexibility and a high reliability.

In some optional examples, the frequency modulation unit 20 is configured to perform voltage-current conversion and operation processing based on the periodic signal, and obtain a frequency modulation current required for performing frequency modulation on the clock signal of the switching power supply to be controlled (that is, the switching power supply to be controlled, or the switching power supply to be modulated in frequency).

Figure 3:
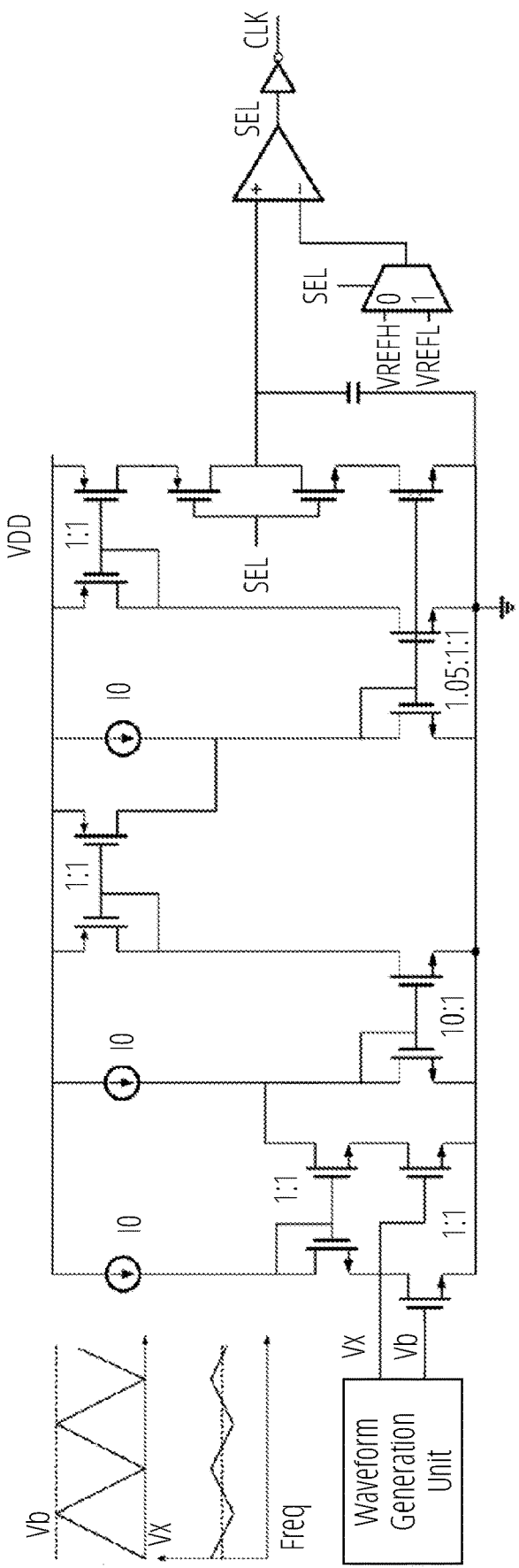
FIG. 3 is a schematic structure diagram of a frequency modulation device (such as an oscillator with a frequency modulation function) according to some embodiments of the present disclosure.
Figure 4:
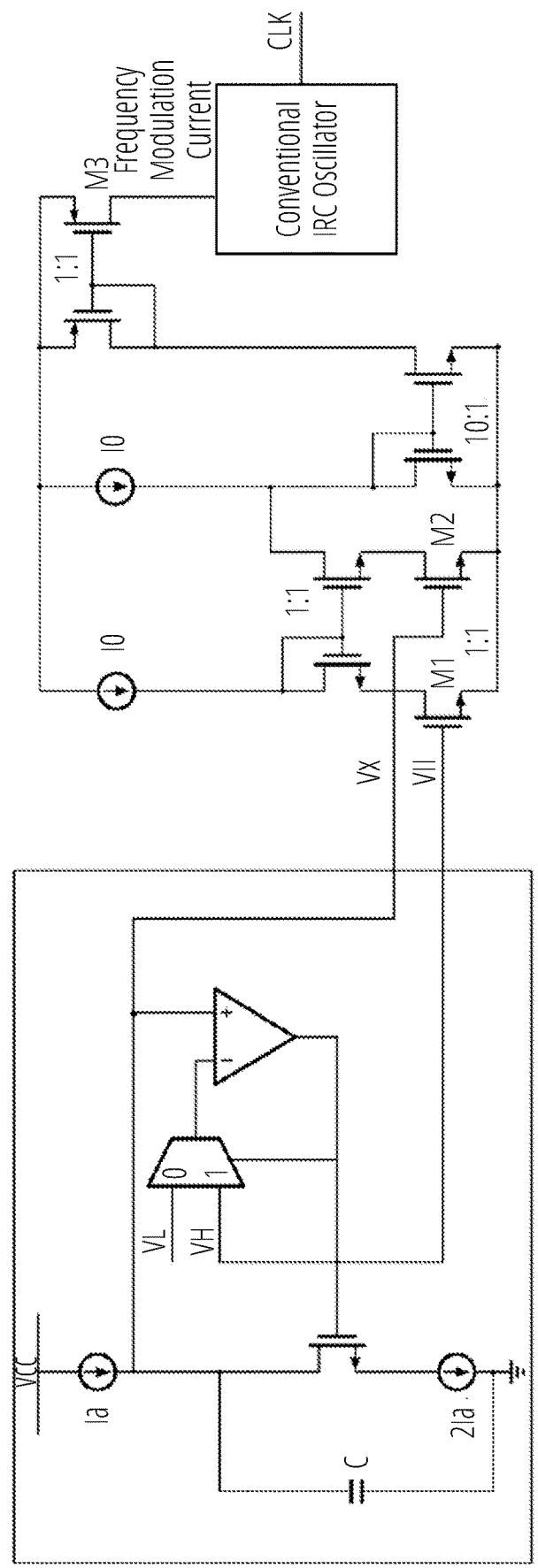
FIG. 4 is a schematic structure diagram of a frequency modulation device (such as a frequency modulation circuit) according to some embodiments of the present disclosure.

For example, the left half of FIG. 3, that is, a part of FIG. 4 excluding the oscillator block, is the frequency modulation circuit. This part shows the principle implementation of the technology of the present disclosure. This circuit functions to generate a frequency modulation current $\triangle I$, and the basic principle of the generation of $\triangle I$ is shown in FIGS. 3 to 5.

In some optional examples, the RC oscillation unit 30 is configured to perform RC oscillation processing based on the frequency modulation current to obtain a frequency oscillation signal as the clock signal of the switching power supply to be controlled.

Figure 2:
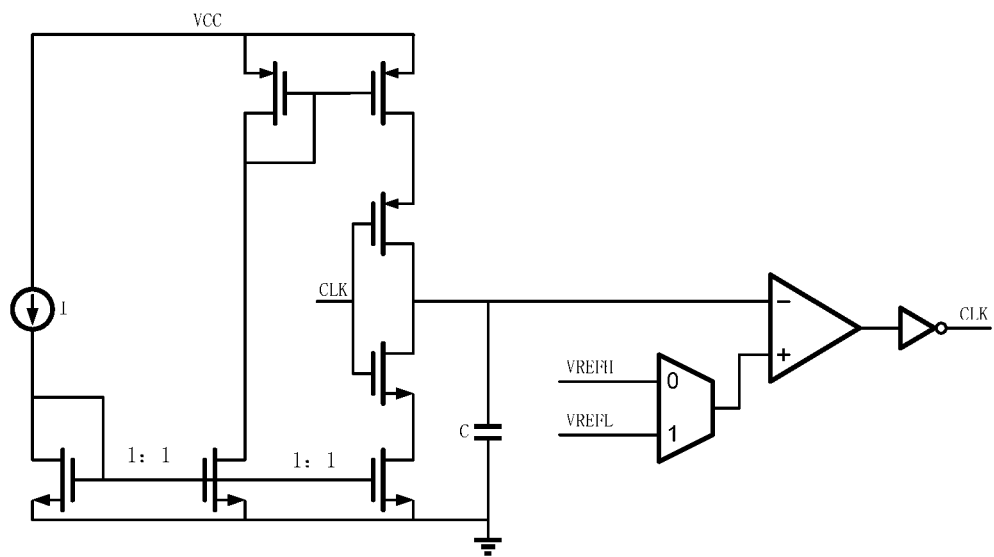
FIG. 2 is a schematic structure diagram of an oscillator known to the inventors.

For example, as shown in FIG. 2, in an initial state, a capacitor voltage is 0, a comparator compares the capacitor voltage to a reference voltage VREFH, and an outputted CLK signal is a low-level signal. Then the outputted CLK signal (that is, the low-level signal outputted when the capacitor voltage is 0) controls an upper switch to turn on, and the current flows into the capacitor to charge; when the capacitor voltage is charged to exceed the reference voltage VREFH, the comparator flips, and the outputted CLK signal becomes a high-level signal; and at the same time, a logic is selected to switch the reference voltage of the same direction ends of the comparator to another reference voltage VREFL. Then the CLK signal (that is, the high-level signal outputted when the capacitor voltage is charged to exceed the reference voltage VREFH) controls a lower switch to turn on, and the current flows from the capacitor to discharge; when the capacitor voltage is lower than the reference voltage VREFL due to the discharge, the comparator again flips, the outputted CLK signal is a low-level signal; the logic is selected to switch the reference voltage of the same direction ends of the comparator back to the previous reference voltage VREFH, and then the CLK signal (that is, the low-level signal outputted when the capacitor voltage is lower than the reference voltage VREFL due to the discharge) controls the upper switch to turn on and restart the charging process, so that the outputted CLK signal is a periodic oscillation signal.

Figure 5:
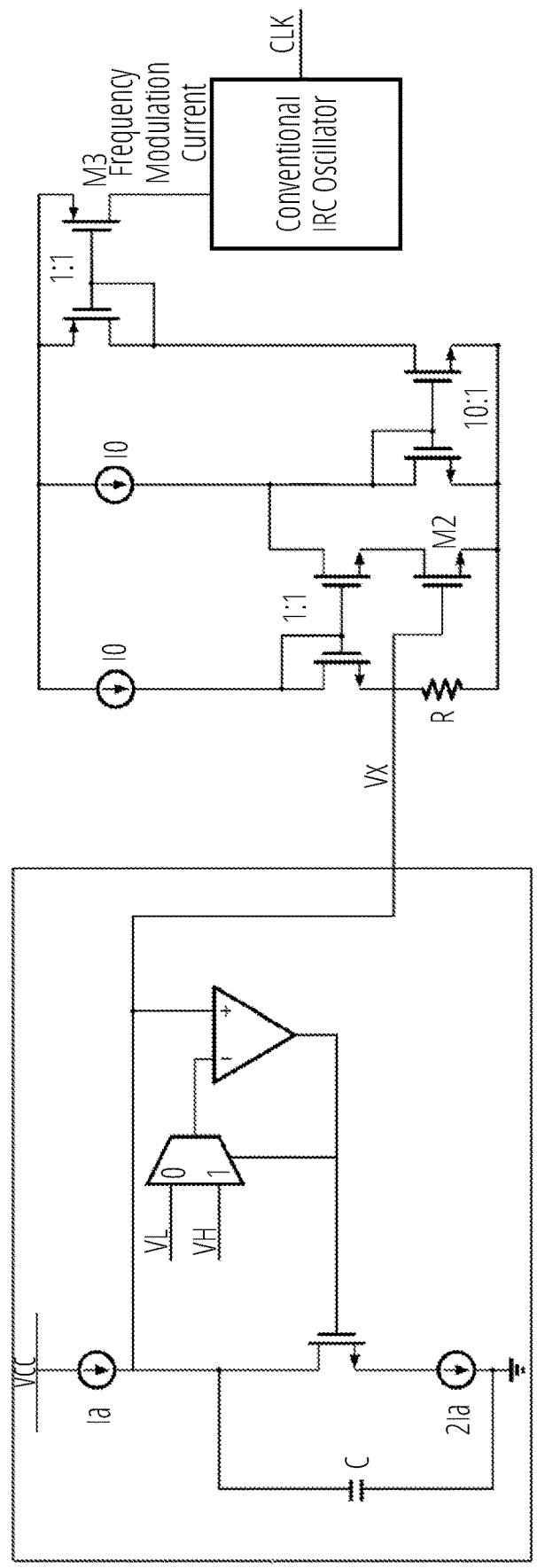
FIG. 5 is a schematic structure diagram of a frequency modulation device (such as a deformation circuit of the frequency modulation circuit) according to an alternative embodiment of the present disclosure.

For example, examples shown in FIGS. 3 to 5, when Vx=0, the frequency modulation current is maximum, the frequency modulation current satisfies $\triangle I=0.1I$, at this time a charge-discharge current is modulated to 1.05I, consequently the frequency is modulated as:

$$f=1.05*I/[2C(VREFH-VREFL)]=1.05*f0.$$

Subsequently, when Vx is between 0 and Vb, as Vx increases, $\triangle I$ decreases from 0.1I, the charge-discharge current also decreases from 1.05I, and the frequency also decreases.

When Vx≥Vb, the frequency modulation current is minimum, $\triangle I=0$, at this time the charge-discharge current is modulated to 0.95I, consequently the frequency is modulated as:

$$f=0.95*I/[2C(VREFH-VREFL)]=0.95*f0.$$

Subsequently, when Vx is between 0 and Vb, as Vx decreases, $\triangle I$ starts to increase from 0, the charge-discharge current also start to increase from 0.95I, and the frequency also increases.

Therefore, the frequency modulation unit is provided to perform the voltage-current conversion and operation processing on the periodic signal generated by the waveform generation unit to obtain the corresponding frequency modulation current, and then the RC oscillation unit performs the RC oscillation processing based on the frequency modulation current to obtain the required clock signal, which is conducive to improving the EMC performance of the switching power supply to be controlled, and the frequency modulation has a simple structure and a good flexibility.

In some optional examples, the RC oscillation unit 30 includes an RC oscillator.

Therefore, the RC oscillator is utilized to implement the RC oscillation based on the frequency modulation current, a clock signal with an adjustable frequency is generated, accordingly the structure is simple and the reliability is high.

In other some optional examples, the waveform generation unit 10 is further configured to generate a reference signal (such as a reference signal Vb or a reference signal VH) capable of being compared with the periodic signal, as a set reference signal capable of being compared with the periodic signal.

In other some optional examples, the frequency modulation unit 20 performs the voltage-current conversion and operation processing based on the periodic signal, specifically, the frequency modulation unit 20 is configured to perform the voltage-current conversion and the operation processing based on the periodic signal and the reference signal.

For example, referring to the examples shown in FIGS. 3 to 5, a periodic signal Vx is generated by the waveform generation unit, and the period of the signal Vx is much lower than the oscillation frequency f0 of the oscillator. The voltage-current conversion and arithmetic circuit converts the periodic signal Vx into a frequency modulation current inputting to the oscillator, that is, the output frequency of the oscillator is modulated.

Therefore, the waveform generation unit is utilized to generate a reference signal while generating the periodic signal, and then the frequency modulation unit performs the voltage-current conversion and operation processing based on the periodic signal and the reference signal to obtain the required frequency modulation current, such that the reference of the operation can be flexibly adjusted, which is conducive to further improving the flexibility and universality of the frequency modulation.

In some optional examples, the frequency modulation unit 20 includes a voltage-current conversion module and an operation module.

Specifically, the voltage-current conversion module includes a first current mirror, a second current mirror, and a third current mirror. The second current mirror is respectively connected to the first current mirror and the third current mirror. The third current mirror is further connected to the RC oscillation unit 30. The first current mirror and the third current mirror is configured to combine with scaling processing of the second current mirror to implement the voltage-current conversion and obtain the desired frequency modulation current. The second current mirror is configured to implement the scaling processing. For example, the first current mirror includes an NMOS transistor. The third current mirror includes a PMOS transistor.

Specifically, in some examples, the operation module includes a reference module and a control module. The reference module and the control module are respectively connected to the waveform generation unit 10, the first current mirror and the third current mirror. The reference module is configured to provide a fixed reference signal for comparison with the periodic signal, or to receive a set reference signal for comparison with the periodic signal. The control module is configured to receive the periodic signal, and control the first current mirror and the third current mirror based on a comparison result of the periodic signal and the fixed reference signal or the set reference signal.

For example, the structure of the frequency modulation circuit is shown in FIG. 4, which consists of a waveform generation unit (a port of FIG. 4 in the dashed block) and a voltage-current conversion and arithmetic circuit (the rest of FIG. 4).

As a result, the voltage-current conversion processing is implemented through the first, the second and the third current mirrors, the operation processing is implemented through the reference module and the control module, and then frequency modulation processing based on the periodic signal and the fixed reference signal or set reference signal is implemented. The structure is simple, and has a high reliability and a good stability.

More optionally, in some examples, the first current mirror includes a first MOS transistor and a second MOS transistor. The second current mirror includes a third MOS transistor and a fourth MOS transistor. The third current mirror includes a fifth MOS transistor and a sixth MOS transistor.

Specifically, a gate and a drain of the first MOS transistor, a gate and a drain of the second MOS transistor, a gate and a drain of the third MO transistor, and a gate of the fourth MOS transistor, a source of the fifth MOS transistor, and a source of the sixth MOS transistor are connected.

Specifically, the source of the first MOS transistor is connected to the reference module, the source of the second MOS transistor is connected to the control module, the source of the third MOS transistor is grounded, and the source of the fourth MOS transistor is grounded; the drain of the fourth MOS transistor, the drain and gate of the fifth MOS transistor, and the gate of the sixth MOS transistor are connected. The source of the sixth MOS transistor is connected to the RC oscillation unit 30.

Therefore, the first, second and third current mirrors are formed through the first to sixth MOS transistors. Accordingly, the structure is simple and has a good stability.

Further optionally, in the first current mirror, the first MOS transistor, the second MOS transistor, the third MOS transistor, and the fourth MOS transistor are all NMOS transistors. In the third current mirror, the fifth MOS transistor and the sixth MOS transistor are both PMOS transistors.

Further optionally, in some examples, the second current mirror includes a scaling current mirror.

Therefore, the voltage-current conversion and the operation processing are implemented through the combination of the NMOS transistor, the PMOS transistor and the scaling current mirror. The processing is simple, and the processing result is reliable.

More optionally, in some examples, the reference module includes a seventh MOS transistor or a sampling resistor. The control module includes an eighth MOS transistor.

Specifically, if the reference module includes a seventh MOS transistor, a gate of the seventh MOS transistor is connected to a reference signal output terminal of the waveform generating unit 10, and a drain of the seventh MOS transistor is connected to the first current mirror (for example, the drain of the seventh MOS transistor is connected to the source of the first MOS transistor), and the source of the seventh MOS transistor is grounded.

Alternatively, if the reference module includes a sampling resistor, the sampling resistor is connected to the first current mirror. For example, a first connection end of the sampling resistor is connected to the source of the first MOS transistor, and a second connection end of the sampling resistor is grounded.

Specifically, the gate of the eighth MOS transistor is connected to the periodic signal output terminal of the waveform generation unit 10, and the drain of the eighth MOS transistor is connected to the first current mirror (for example, the drain of the eighth MOS transistor is connected to the source of the second MOS transistor), and the source of the eighth MOS transistor is grounded.

Therefore, by using the seventh MOS transistor or sampling resistor as the reference module, the reference module can be flexibly set according to actual requirements for the reference signal, which has a wide application range and a good processing flexibility; by using the eighth MOS transistor as the control module, the structure is simple, and has a high reliability.

The seventh MOS transistor and the eighth MOS transistor are both NMOS transistors.

Therefore, by using the NMOS transistors as the reference module and the control module, the control mode is simple and the control result is highly reliable.

After a large number of experiments, the technical solution of the present disclosure is adopted to implement the frequency modulation based on the RC oscillator known to the inventors in the integrated circuit, which can stably implement the switching frequency modulation of a chip, greatly optimize the EMC performance of the switching power supply, and the modulation mode is simple and flexible.

According to some embodiments of the present disclosure, a switching power supply corresponding to the frequency modulation device is further provided. The switching power supply can include the frequency modulation device described above.

In an alternative embodiment, in order to address the problem of low EMC performance of the switching power supply using a fixed-frequency oscillator, the frequency modulation technology needs to be introduced. The current industry has the frequency modulation (such as frequency jittering) technology, and the present disclosure is intended to provide a new frequency modulation technology (such as a new frequency modulation technology different from the current frequency modulation technology in the industry), and the new frequency modulation technology has a simple principle, and is easy to implement, and can be widely used in various applications.

Specifically, the solution of the present disclosure is to adopt a brand-new design idea and a brand-new circuit architecture in an integrated circuit to implement the frequency modulation, thereby greatly optimizing the EMC performance of the switching power supply.

In some optional examples, the frequency modulation technology provided in the present disclosure is configured to stably implement the switching frequency modulation of the chip and optimize the EMC performance of the switching power supply system. Compared with the frequency modulation technology known to the inventors, the principle of the frequency modulation technology of the present disclosure is simple and ingenious, and is not easily affected by fluctuations of the semiconductor technology (that is, is independent of the technology), and is easy to implement, and has a strong practicality, such as extremely strong practicality in the integrated circuit of the switching power supply.

Frequency modulation: for a generally ordinary oscillator, the designed oscillation frequency thereof is fixed. For example: an RC oscillator of 100K, the oscillation frequency thereof is fixed at 100 KHz. The frequency modulation refers to modulate the oscillation frequency. A result of the modulation is that the oscillation frequency of the RC oscillator of 100K using this frequency modulation technology periodically oscillates in a small range around 100 KHz, for example, the frequency oscillates in a range of 95 KHz to 105 KHz.

In the following, how the frequency modulation can optimize the EMC noise interference in principle will be introduced.

Generally, for an ordinary oscillator, such as an RC oscillator of 100K, which has a fixed oscillation frequency of 100 KHz (fundamental frequency). It is well known that a periodic signal consists of the first harmonic, the second harmonic, the third harmonic, . . . , and the N-th harmonic of the signal. Therefore, frequencies of all harmonic signals contained in the periodic signal are also fixed accordingly. For example, (fundamental frequency) periodic oscillation signal of 100 KHz, the frequency of the first harmonic is 100 KHz, the frequency of the second harmonic is 200 KHz, the frequency of the third harmonic is 300 KHz, and the frequency of the N-th harmonic is N*100 KHz. The energy contained in the periodic oscillation signal of 100 KHz is also distributed in these harmonic signals.

The attenuation amplitude of a fixed switching power supply system to the noise at different frequencies is different. The fixed switching power supply system definitely has a weaker attenuation capability to the noise at certain frequencies, and if there is a harmonic of the switching frequency having a higher energy at this frequency, then the switching power supply system can produce an interference signal having a larger energy to affect the operation of other circuits.

The frequency modulation technology functions to extend a natural frequency of the oscillator from a fixed frequency to a frequency range. That is, each period of an oscillation signal is originally a fixed frequency (assumed to be 100 KHz), under the frequency modulation technology, the frequency of each period can be any frequency in a certain frequency range (such as a range of 95K to 105 KHz). Accordingly, in terms of a frequency spectrum, the original fundamental wave energy is concentrated at the frequency of 100 KHz. If the switching power supply system has a weaker attenuation capability to the noise at the frequency of 100 KHz, from the EMC test of the system, it can be easily seen that there is high-energy interference noise at the frequency of 100 KHz, which can greatly limit the application of switching power supply. Look again, if the frequency modulation is applied, the fundamental wave is broadened from the frequency point of 100 KHz to the frequency range of 95K to 105 KHz. Therefore, the original fundamental wave energy can be evenly distributed in the frequency range of 95K to 105 KHz. For a single frequency in the frequency range of 95K to 105 KHz, such as the frequency point of 100 KHz, an energy density thereof is greatly reduced compared to the case without the frequency modulation. Therefore, even if the switching power supply system has a weaker attenuation capability to the noise at the frequency point of 100 KHz, the EMC test of the system shows that there is no high-energy interference noise at the frequency point of 100 KHz, which can effectively improve the EMC performance.

Moreover, the principle of the frequency modulation technology provided in the present disclosure is easy to understand and can be easily understood with a certain foundation in physics and electricity. For the frequency modulation technology provided in the present disclosure, the implementation thereof is almost independent of the waveform of the process parameters. For example, the frequency modulation technology of the present disclosure can modulate the oscillation frequency of the RC oscillator from the original 100 KHz to the range of 95 KHz to 105 KHz, and the modulated amplitude (such as +/−5% of 100K) is only determined by the design parameter of the current mirror proportion, which is independent of the fluctuation of the technology parameter.

In an optional specific embodiment, the specific implementation process of the present disclosure can be exemplified in conjunction with the examples shown in FIGS. 2 to 7.

FIG. 2 illustrates a typical oscillator circuit. As shown in FIG. 2, the CLK signal (i.e., clock signal) controls the upper and lower switches (such as MOS switches). The MOS transistor above the upper switch forms a current mirror to obtain the charge current of the capacitor C; the MOS transistor below the lower switch forms a current mirror to obtain the discharge current of the capacitor C. The working principle of the oscillator shown in FIG. 2 can be as follows.

In the initial state, the capacitor voltage is 0, the comparator compares the capacitor voltage with the reference voltage VREFH, and the outputted CLK signal is a low-level signal. Then the outputted CLK signal (that is, the low-level signal outputted when the capacitor voltage is 0) controls the upper switch to turn on, and the current flows into the capacitor to charge; when the capacitor voltage is charged to exceed the reference voltage VREFH, the comparator flips, and the outputted CLK signal becomes a high-level signal, and at the same time, the logic is selected to switch the reference voltage of the same direction ends of the comparator to another reference voltage VREFL. Then the CLK signal (that is, the high-level signal outputted when the capacitor voltage is charged to exceed the reference voltage VREFH) controls the lower switch to turn on, and the current flows from the capacitor to discharge; when the capacitor voltage is lower than the reference voltage VREFL due to the discharge, the comparator again flips, the outputted CLK signal is a low-level signal. The logic is selected to switch the reference voltage of the same direction ends of the comparator back to the previous reference voltage VREFH, and then the CLK signal (that is, the low-level signal outputted when the capacitor voltage is lower than the reference voltage VREFL) controls the upper switch to turn on and restart the charge process, accordingly the outputted CLK signal is a periodic oscillation signal.

Specifically, the oscillation period T can be given by the following formula: $I*T=2(VREFH-VREFL)*C$, where I is the current source current, C is the capacitance of the charge capacitor, and VREFH and VREFL are the reference voltages used for switching.

In an alternative specific example, compared with the solution shown in FIG. 2, a frequency modulation circuit is added in the solution shown in FIG. 3.

Specifically, the structure of the IRC oscillator known to the inventors (that is, the RC oscillator known to the inventors) is shown in FIG. 2, which mainly consists of three portions: a charge-discharge circuit, a capacitor, and a comparison logic portion.

Referring to the example shown in FIG. 2, the charge-discharge circuit charges the capacitor voltage to VREFH in one half period, and discharges the capacitor voltage to VREFL in the other half period. When the capacitor voltage is stable and periodically charged and discharged, the oscillator output frequency satisfies: $I*T=2(VREFH-VREFL)*C$.

The frequency conversion satisfies: $f=I/[2C(VREFH-VREFL)]=f$, where f is the oscillator output frequency, T is the oscillation period, and $f=1/T$.

Figure 6:
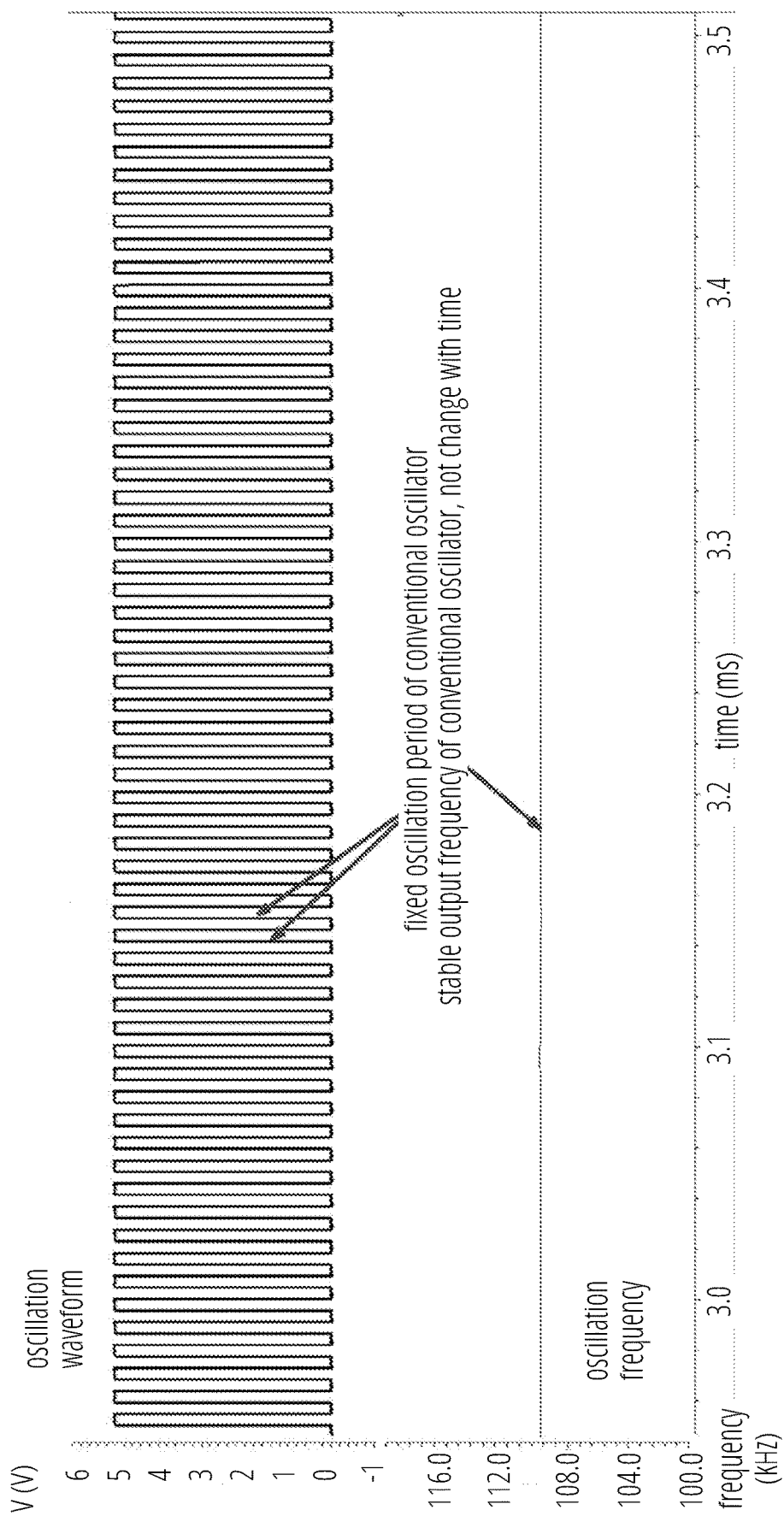
FIG. 6 is a schematic diagram illustrating a frequency curve of an oscillator known to the inventors.

The oscillation waveform of the oscillator shown in FIG. 2 can be as shown in FIG. 6. This frequency is the fixed output frequency of the oscillator when the oscillator is stable.

However, the oscillator shown in FIG. 2 is applied to a switching power supply control chip. If the switching frequency of the chip is fixed at a certain frequency point, the switching power supply system can cause great electromagnetic noise interference to the power supply network at this frequency point, that is, the EMC performance is lower.

For the oscillator shown in FIG. 2, if the switching frequency can be dispersed into a certain slightly wider frequency range, the electromagnetic interference generated by the switching power supply system in this frequency range can be dispersed to various frequency points in the frequency range, such that compared with the electromagnetic interference noise amplitude caused by the fixed switching frequency, the electromagnetic interference amplitude of any single frequency point in the frequency range is sharply reduced, which greatly improves the EMC performance.

For example, for the oscillator shown in FIG. 2, the frequency of each oscillation period of the switching is not fixed through the frequency modulation, but floats up and down the fixed frequency. For example, the original switching frequency of 100K, after the frequency modulation, now the frequency of any switching period can be any frequency within the range of +/−5% of 100K. That is to say, the original frequency point of 100 KHz is broadened to the frequency range of 95 KHz to 105 KHz.

In alternative specific examples, the solution shown in FIG. 4 specifically implements a frequency modulation circuit including a waveform generation unit, which replaces the IRC oscillator circuit known to the inventors (that is, the RC oscillator known to the inventors, and an internal circuit thereof is the circuit shown in FIG. 2).

The structure of the IRC (that is, the RC) with the frequency modulation function is shown in FIG. 4, which mainly consists of four portions: a charge-discharge circuit, a capacitor, a comparison logic portion and a frequency modulation circuit.

The oscillator shown in FIG. 4 has the same principle as the IRC oscillator known to the inventors (i.e., the RC oscillator known to the inventors), and the average frequency of the oscillator is still given by the following formula:

$$f=I/[2C(VREFH-VREFL)]=f0.$$

The oscillator shown in FIG. 4 differs from the IRC oscillator known to the inventors in that a frequency modulation current $\triangle I$ is additionally superimposed on the charge-discharge current I.

In an optional specific example, the solution shown in FIG. 5, compared with the solution shown in FIG. 4, replaces that in FIG. 4 by replacing M1 with a resistor R. The principle is the same as that of FIG. 4.

The left half of FIG. 3, that is, a part of FIG. 4 excluding the oscillator block is the frequency modulation circuit. This part shows the principle of implementation of the technology of the present disclosure. The circuit functions to generate frequency modulation current $\triangle I$. The basic generation principle of $\triangle I$ can be illustrated in FIGS. 3 to 5, but the specific implementation method may be non-unique. The original intention of the present disclosure is to protect the design idea of modulating a frequency by modulating a current, rather than protecting one or several circuit structures that generate the frequency modulation current $\triangle I$.

In the solution of the present disclosure, the oscillator frequency is given as: $f=I/[2C(VREFH-VREFL)]$; after the frequency modulation, the oscillator frequency satisfies: $f=(I+\triangle I)/[2C(VREFH-VREFL))]$. Therefore, different oscillation frequencies can be obtained by generating different frequency modulation currents $\triangle I$.

In the following, the frequency modulation principle in the solution of the present disclosure will be illustrated with reference to the examples shown in FIGS. 3 to 5.

As shown in the examples in FIGS. 3 to 5, when Vx=0, the frequency modulation current is maximum, and the frequency modulation current satisfies $\triangle I=0.1I$. At this time, the charge-discharge current is modulated to 1.05I, then the frequency is modulated as:

$$f=1.05*I/[2C(VREFH-VREFL)]=1.05*f0.$$

Subsequently, when Vx is between 0 and Vb, as Vx increases, $\triangle I$ decreases from 0.1I, the charge-discharge current also decreases from 1.05I, and the frequency also decreases.

When Vx Vb, the frequency modulation current is minimum, $\triangle I=0$, at this time the charge-discharge current is modulated to 0.95I, then the frequency is modulated as:

$$f=0.95*I/[2C(VREFH-VREFL)]=0.95*f0.$$

Subsequently, when Vx is between 0 and Vb, as Vx decreases, $\triangle I$ starts to increase from 0, the charge-discharge current also start to increase from 0.95I, and the frequency also increases.

Figure 7:
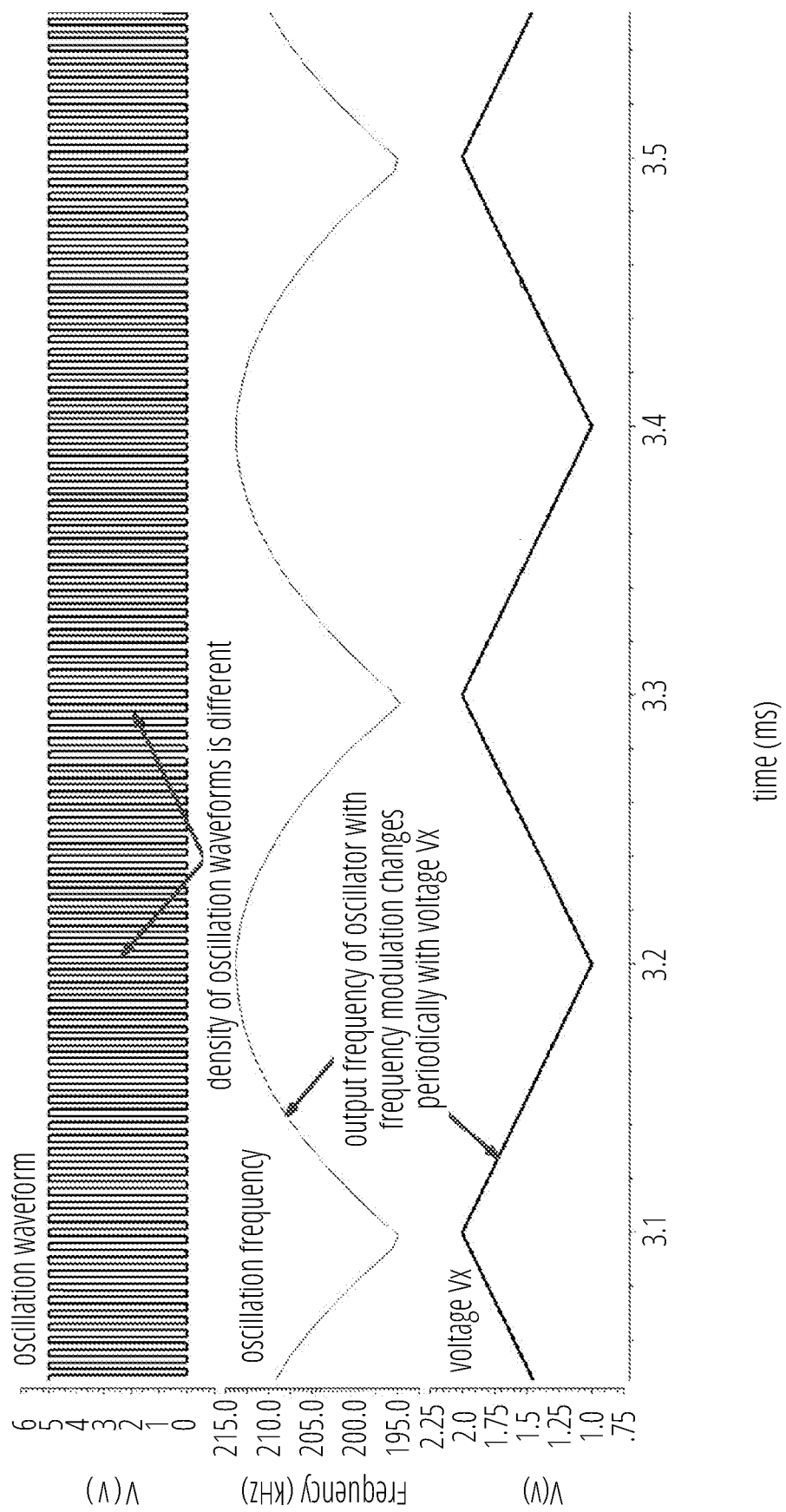
FIG. 7 is a schematic diagram illustrating a frequency curve of a frequency modulation device (such as an oscillator with frequency modulation) according to some embodiments of the present disclosure.

The oscillation waveform modulated by any of the frequency modulation modes in FIGS. 3 to 5 is shown in FIG. 7, and the modulation period is equal to the period of the signal Vx.

For example, structure of the frequency modulation circuit is shown in FIG. 4, which consists of a waveform generation unit (the portion in the dashed block in FIG. 4) and a voltage-current conversion and arithmetic circuit (the rest in FIG. 4). The modulation circuit is original, but it is merely an embodiment of implementing the generation of a modulation current $\triangle I$.

Referring to the examples shown in FIGS. 3 to 5, the waveform generation unit generates a periodic signal Vx, and the period of the signal Vx is much lower than the oscillation frequency f0 of the oscillator. The voltage-current conversion and arithmetic circuit converts the periodic signal Vx into a frequency modulation current to input to the oscillator, that is, the output frequency of the oscillator is modulated. This is the modulation principle of $\triangle I$. In order to facilitate understanding, another elaboration is provided as follows.

The frequency formula is provided as: $f=I/[2C(VREFH-VREFL)]$. Therefore, the modulation of the frequency can be implemented by modulating the current I, and the modulated current is equal to $I+\triangle I$. There are many types of modulation current $\triangle I$, and only the $\triangle I$ is a periodic signal. In the solution of the present disclosure, the modulation current $\triangle I$ is achieved through the periodic signal Vx, which is a feasible embodiment.

The Vb in FIG. 3 and VH in FIG. 4 are both reference signals.

Optionally, in an optimum embodiment exemplified in the present disclosure, the waveform generation unit is configured to generate a triangular wave signal which oscillates periodically. In fact, a unit which generates sine oscillation signals, cosine oscillation signals, square wave oscillation signals, and various other periodic oscillation signals can implement the frequency modulation function. Such simple transformations should be regarded as the idea of the present disclosure and should be protected.

In the frequency modulation circuit, the principle of the voltage-current conversion and arithmetic circuit is very clearly shown in FIG. 4. Those skilled in the industry can easily obtain alternative embodiments with different circuit structures but the same functions and principles through simple transformations. For example, as shown in FIG. 5, the same circuit function can be implemented through simple resistor replacement and proper parameter adjustment. Therefore, all simple transformations made on the principles provided in the present disclosure should be protected.

For example, the working principle of the RC oscillator known to the inventors is described as follows.

The structure principle of the RC oscillator known to the inventors is shown in FIG. 2, which consists of three parts: a charge-discharge circuit, a capacitor, and a comparison logic.

The current source provides a fixed current I which flows into M1, M1, M2 and M3 to form a first group of current mirrors. A mirror ratio is equal to 1:1:1. Therefore, when M2 and M3 works normally, currents thereof are both equal to the current I flowing through M1. The current of M3 discharges the capacitor C when the switching transistor M4 is turned on, and the discharge current is equal to I. The circuit of M2 is mirrored to M6 through the current mirror M7, and charges the capacitor when the switching M5 is turned on, and the charge current is also equal to I.

In the initial state, the capacitor voltage is 0, no matter which reference (all greater than 0) is selected by a selector X1, the comparator X2 outputs a high level, and after reverse by X3, the CLK level is low, and the selector is controlled to select the reference VREFH. At the same time, CLK controls the switch transistor M5 to turn on, and M4 to turn off. The capacitor C starts to charge, the charge current is I (described earlier).

When the voltage of the capacitor C exceeds the reference VREFH, the comparator X2 flips to a low level, and after the reverse by the X3, the CLK level is high, and the selector is controlled to select the reference VREFL. At the same time, CLK controls the switch transistor M4 to turn on, and M5 to turn off. The capacitor C begins to discharge, and the discharge current is also I (described earlier).

When the voltage of the capacitor C is lower than the reference VREFL, the comparator X2 flips again to the high level, and after the reverse by the X3, the CLK level is low, and the selector is controlled to select the reference VREFH. At the same time, the CLK controls the switch transistor M5 to turn on, and M4 to turn off. The capacitor C starts to charge again, and the charge current is also I (described earlier).

The charge-discharge circuit charges to increase the capacitor voltage from VREFL to VREFH within half a period, satisfying:

$I*T/2=(VREFH-VREFL)*C.$

In another half a period, the charge-discharge circuit discharges to decrease the capacitor voltage from VREFH to VREFL, satisfying:

$I*T/2=(VREFH-VREFL)*C.$

When the capacitor voltage is stable and periodically charged and discharged, the oscillator output frequency satisfies:

$I*T=2(VREFH-VREFL)*C,$ $f=I/[2C(VREFH-VREFL)].$

The current source I is constant, the capacitance value C is fixed, and the reference voltages VREFL and VREFH are fixed, accordingly the frequency f is also fixed and does not change with time.

The principle of frequency modulation circuit is provided as follows:

Referring to the right half of FIG. 3, which is basically the same as FIG. 2, except that one more current $\triangle I$ is introduced. In addition, the ratio of the current mirror Ma to the current mirror Mb to the current mirror Mc is adjusted to 1.05:1:1. Therefore, when the frequency modulation current $\triangle I$ varies from 0 to 0.1I and the average value is 0.05I, the current flowing through Mb and Mc also varies from 0.95I to 1.05I, and the average value is still equal to I.

Similar to the principle of the IRC oscillator known to the inventors, the average frequency of the oscillator is still given by the following formula:

$f=I/[2C(VREFH-VREFL)]=f0.$

Different from the IRC oscillator known to the inventors, the charge-discharge current I is additionally superimposed with a frequency modulation current $\triangle I$. The left half of FIG. 3 is the frequency modulation circuit, which functions to generate a periodically changing frequency modulation current $\triangle I$. The waveform generation unit generates two voltage signals, Vx and Vb. Vb is the reference voltage signal with a fixed voltage. Vx is a periodically changing voltage signal, which periodically changes from 0 to Vb (referring to the upper left waveform in FIG. 3). The period of Vx change is much less than the output frequency of the IRC oscillator in the right half of FIG. 3. Therefore, in a single period of the IRC oscillator, the default frequency modulation current $\triangle I$ does not change.

Functions and principles of various components of the frequency modulation circuit are introduced below.

Referring to FIG. 3, a frequency modulation core circuit consists of M1, M2, M3 and M4, and a current source I0 (with a current value I) connected to a drain of M3, and functions to generate a periodically changing current Ix. M1 and M2 are compatible in size, and M3 and M4 are the same size.

The reference voltage Vb drives M1, M1 to turn on, and the on-resistance is R0, then the drain voltage of M1 is equal to I*R0. In the alternative embodiment shown in FIG. 5, this is replaced with a real resistor R, and the principle remains unchanged. M3 is a diode connection, and a conduction voltage drop thereof is Vgsm3, accordingly the gate-drain voltage of M3 equals to Vgsm3+I*R0. The gates of M4 and M3 are short-circuited, accordingly the gate voltage of M4 is also equal to Vgsm3+I*R0. M3 and M4 have the same size. When the size is reasonable, the gate-source voltage of M4 is equal to the gate-source voltage of M3, and has very little correlation with the current passing through M4, that is, Vgsm4=Vgsm3 but the relationship with Ix is ignored. Therefore, the source voltage of M4 is equal to Vgsm3+I*R0−Vgsm4=I*R0. The on-resistance of M2 changes with a driving voltage Vx thereof. When Vx=0, M2 is cut off, and the on-resistance Rx is infinite. When Vx rises to the voltage Vb, the working state of M2 is the same as that of M1. At this time, the on-resistance Rx of M2 is the maximum, which is also equal to (the on-resistance of M1) R0. Let the on-resistance Rx of M2 be a function of the driving voltage Vx thereof, as follows:

Rx=f(Vx), where Vx∈(0,Vb), Rx∈(R0,+∞), Rx and Vx change in opposite directions.

From the above, the current Ix flowing through M2 and M4 satisfies:

$$Ix=I*R0/Rx=I*R0/f(Vx).$$

When Vx=0, M2 is cut off, f(Vx) is infinite, and the current satisfies Ix=0 when passing through M4. Since the ratio of the current mirror M5 to the current mirror M6 is equal to 10:1, the current flowing through M6 satisfies (I−Ix)/10=0.1I. The ratio of the current mirror M7 to the current mirror M8 is equal to 1:1, the frequency modulation current is maximum this moment, and satisfies $\triangle$ I=(I−Ix)/10=0.1I.

At this time, the charge-discharge current of the capacitor is modulated as satisfying (1+$\triangle$ I)/1.05=1.05I, accordingly the frequency is modulated as satisfying:

$$f=1.05*I/[2C(VREFH-VREFL)]=1.05*f0.$$

Then Vx gradually increases from 0 to Vb. As Vx increases, f(Vx) decreases, Ix increases, $\triangle$ I=(I−Ix)/10 drops from 0.1I, and the charge-discharge current (I+$\triangle$ I)/1.05 also decreases from 1.05I, and the frequency f also decreases.

When Vx increases to Vb, f(Vx)=R0, Ix=I, $\triangle$ I=(I−Ix)/10=0, and the frequency modulation current is the minimum. At this time, the charge-discharge current is modulated as satisfying (1+$\triangle$ I)/1.05=0.95I, then the frequency is modulated as satisfying: f=0.95*I/[2C(VREFH−VREFL)]=0.95*f0.

Then when Vx is between 0 and Vb, as Vx decreases, $\triangle$ I starts to increase from 0, the charge-discharge current also start to increase from 0.95I, and the frequency also increases.

Therefore, the output frequency of the IRC oscillator in the right half of FIG. 3 changes periodically with the period of Vx. The period of change is determined by the period of Vx, and the amplitude of change is determined by the ratio of current mirror M5 to the current mirror M6, the ratio of the current mirror M7 to the current mirror M8, and the ratio of the current mirror Ma to the current mirror Mb to the current mirror Mc.

The principle of the waveform generation unit is provided as follows:

Compared with FIG. 3, FIG. 4 illustrates an actual waveform generation unit (the left half of the block diagram). A periodic signal Vx is generated by the waveform generation unit, and the period of the signal Vx is much lower than the oscillation frequency f0 of the oscillator. Then the frequency modulation circuit performs the voltage-current conversion and arithmetic, and converts the periodic signal Vx into a frequency modulation current to input into the oscillator, that is, the output frequency of the oscillator is modulated.

A waveform conversion unit is a simple IRC oscillator, the outputted Vb thereof is the reference voltage of the oscillator, and the outputted Vx is the voltage of the charge-discharge capacitor C. The oscillation principle is the same as that of the IRC oscillator known to the inventors.

In addition, as for the simulation results in the solution of the present disclosure, please refer to examples shown in FIG. 6 and FIG. 7. FIG. 6 shows the output frequency of ani oscillator without the frequency modulation function, and FIG. 7 shows the output frequency of the oscillator with the frequency modulation function.

Since the processing and functions implemented by the switching power supply in this embodiment substantially correspond to the embodiments, principles, and examples of devices shown in FIGS. 1 to 7, as for the description of this embodiment which is not exhaustive, please refer to the relevant description in the foregoing embodiments, which will not be repeated here.

After a large number of experiments, in the technical solution of the present disclosure, and the periodic signal is converted into a frequency modulation current to input into the oscillator by a voltage-current conversion and arithmetic circuit, which can implement the switching frequency modulation of the chip and improve the EMC performance of the switching power supply; further, the reliability is high and the safety is good.

Figure 8:
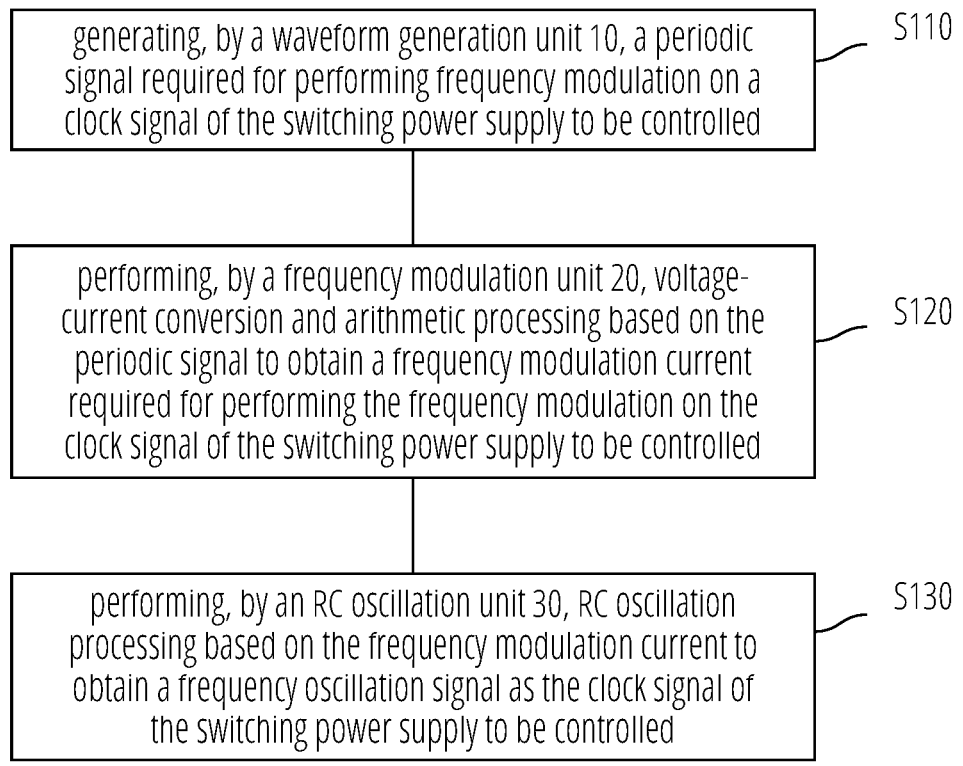
FIG. 8 is a flow chart showing a frequency modulation method for a switching power supply according to some embodiments of the present disclosure.

According to some embodiments of the present disclosure, a frequency modulation method for a switching power supply corresponding to the switching power supply is further provided, as shown in FIG. 8, which is a flow chart showing a method according to some embodiments of the present disclosure. The frequency modulation method includes following steps S110 to S130.

At step S110, the waveform generation unit 10 generates a periodic signal required for performing frequency modulation on a clock signal of a switching power supply to be controlled, i.e., a periodic signal required for performing frequency modulation on the switching power supply to be modulated in frequency.

At step S120, the frequency modulation unit 20 performs voltage-current conversion and arithmetic processing based on the periodic signal to obtain a frequency modulation current required for performing the frequency modulation on the clock signal of the switching power supply to be controlled (that is, the switching power supply is to be controlled, or the switching power supply is to be modulated in frequency).

For example, the left half of FIG. 3, that is, a part of FIG. 4 excluding the oscillator block, is the frequency modulation circuit. This part shows the implementation principle of the disclosure technology. This circuit functions to generate the frequency modulation current $\triangle$ I, and the basic generation principle of $\triangle$ I can be illustrated in FIGS. 3 to 5.

In step S130, the RC oscillation unit 30 performs RC oscillation processing based on the frequency modulation current to obtain a frequency oscillation signal as the clock signal of the switching power supply to be controlled.

For example, as shown in FIG. 2, in the initial state, the capacitor voltage is 0, the comparator compares the capacitor voltage to the reference voltage VREFH, and the outputted CLK signal is a low-level signal. Then the outputted CLK signal (that is, the low-level signal outputted when the capacitor voltage is 0) controls the upper switch to turn on, and the current flows into the capacitor to charge; when the capacitor voltage exceeds the reference voltage VREFH due to the charge, the comparator flips, and the outputted CLK signal becomes a high-level signal, and at the same time a logic is selected to switch the reference voltage at the same direction ends of the comparator to another reference voltage VREFL. Then the CLK signal (that is, the high-level signal outputted when the capacitor voltage exceeds the reference voltage VREFH due to the charge) controls the lower switch to turn on, and the current flows from the capacitor to discharge; when the capacitor voltage is lower than the reference voltage VREFL, the comparator flips again, the outputted CLK signal is a low-level signal; a logic is selected to switch the reference voltage at the same direction ends of the comparator back to the previous reference voltage VREFH, and then the CLK signal (that is, the low-level signal outputted when the capacitor voltage is lower than the reference voltage VREFL) controls the upper switch to turn on and restart the charge process, then the outputted CLK signal is a periodic oscillation signal.

For example, the examples shown in FIGS. 3 to 5, when Vx=0, the frequency modulation current is the maximum, the frequency modulation current $\triangle I=0.1I$, at this time the charge-discharge current is modulated to 1.05I, accordingly the frequency is modulated as:

$$f=1.05*I/[2C(VREFH-VREFL)]=1.05*f0.$$

Subsequently, when Vx is between 0 and Vb, as Vx increases, $\triangle I$ decreases from 0.1I, the charge-discharge current also decreases from 1.05I, and the frequency also decreases.

When Vx≥Vb, the frequency modulation current is the minimum, $\triangle I=0$, at this time the charge-discharge current is modulated to 0.95I, accordingly the frequency is modulated as:

$$f=0.95*I/[2C(VREFH-VREFL)]=0.95*f0.$$

Subsequently, when Vx is between 0 and Vb, as Vx decreases, $\triangle I$ starts to increase from 0, the charge-discharge current also start to increase from 0.95I, and the frequency also increases.

Therefore, the frequency modulation unit is configured to perform the voltage-current conversion and arithmetic processing on the periodic signal generated by the waveform generation unit to obtain the corresponding frequency modulation current, and then the RC oscillation unit is configured to perform the RC oscillation processing based on the frequency modulation current to obtain the required clock signal, which is conducive to improving the EMC performance of the switching power supply to be controlled, and the frequency modulation has a simple structure and a good flexibility.

Since the processing and functions implemented by the method in the embodiments substantially correspond to the embodiments, principles, and examples of the aforementioned switching power supply, as for the description of the embodiment which is not exhaustive, please refer to the relevant description in the foregoing embodiments, which will not be repeated here.

After a large number of experiments, in the technical solution of the embodiment, periodic signals of different waveforms are converted into frequency modulation current to input into the oscillator by the voltage-current conversion and arithmetic circuit, which can be applied to a variety of occasions that require frequency modulation, and the frequency modulation has a good flexibility and a high reliability.

The technical features of the above-mentioned embodiments can be combined arbitrarily. In order to make the description concise, all possible combinations of the various technical features in the above-mentioned embodiments are not described. However, as long as there is no contradiction in the combination of these technical features, all should be considered as the scope of the present disclosure.

The above-mentioned embodiments merely express several exemplary implements of the present disclosure, and the description is relatively specific and detailed, but it should not be understood as a limitation to the scope of the present disclosure. It should be pointed out that those of ordinary skill in the art can make several transformations and improvements without departing from the concept of the present disclosure, and these all fall within the protection scope of the present disclosure. Therefore, the scope of protection of the present disclosure shall be subject to the appended claims.

What is claimed is:

1. A frequency modulation device, comprising: a waveform generation unit configured to generate a periodic signal required for performing frequency modulation on a clock signal of a switching power supply to be controlled;
   a frequency modulation unit configured to perform voltage-current conversion and arithmetic processing based on the periodic signal to obtain a frequency modulation current required for performing the frequency modulation on the clock signal of the switching power supply to be controlled, and comprising a voltage-current conversion module and an arithmetic module; and
   an RC oscillation unit configured to perform RC oscillation processing based on the frequency modulation current to obtain a frequency oscillation signal as the clock signal of the switching power supply to be controlled;
   wherein the voltage-current conversion module comprises a first current mirror, a second current mirror, and a third current mirror; the second current mirror is respectively connected to the first current mirror and the third current mirror; the third current mirror is further connected to the RC oscillation unit;
   the calculation module comprises a reference module and a control module; and the reference module and the control module are respectively connected to the waveform generation unit, the first current mirror and the third current mirror.

2. The device according to claim 1, wherein:
   the waveform generation unit is further configured to generate a reference signal for comparison with the periodic signal;
   the frequency modulation unit is configured to perform the voltage-current conversion and arithmetic processing based on the periodic signal, and is specifically configured to perform the voltage-current conversion and arithmetic processing based on the periodic signal and the reference signal.

3. The device according to claim 1, wherein the first current mirror comprises a first MOS transistor and a second MOS transistor; the second current mirror comprises a third MOS transistor and a fourth MOS transistor; the third current mirror comprises a fifth MOS transistor and a sixth MOS transistor; wherein
   a gate and a drain of the first MOS transistor, a gate and a drain of the second MOS transistor, a gate and a drain of the third MOS transistor, a gate of the fourth MOS transistor, a source of the fifth MOS transistor, and a source of the sixth MOS transistor are connected;
   a source of the first MOS transistor is connected to the reference module, a source of the second MOS transistor is connected to the control module; a drain of the fourth MOS transistor, a drain and a gate of the fifth MOS transistor, and a gate of the sixth MOS transistor are connected; the source of the sixth MOS transistor is connected to the RC oscillation unit.

4. The device according to claim 3, wherein:
in the first current mirror, the first MOS transistor, the second MOS transistor, the third MOS transistor, and the fourth MOS transistor are all NMOS transistors.

5. The device according to claim 3, wherein in the third current mirror, both the fifth MOS transistor and the sixth MOS transistor are PMOS transistors.

6. The device according to claim 3, wherein the second current mirror comprises a scaling current mirror.

7. The device according to claim 1, wherein the reference module comprises a seventh MOS transistor or a sampling resistor; the control module comprises an eighth MOS transistor; wherein,
- if the reference module comprises a seventh MOS transistor, a gate of the seventh MOS transistor is connected to a reference signal output terminal of the waveform generation unit, and a drain of the seventh MOS transistor is connected to the first current mirror;
- if the reference module comprises a sampling resistor, the sampling resistor is connected to the first current mirror;
- a gate of the eighth MOS transistor is connected to the periodic signal output terminal of the waveform generation unit, and a drain of the eighth MOS transistor is connected to the first current mirror.

8. The device according to claim 7, wherein the seventh MOS transistor and the eighth MOS transistor are both NMOS transistors.

9. The device according to claim 1, wherein the waveform generation unit comprises a signal generation circuit of any one of a triangular wave signal, a sine oscillation signal, a cosine oscillation signal, and a square wave oscillation signal.

10. The device according to claim 1, wherein the RC oscillation unit comprises an RC oscillator.

11. A switching power supply, comprising the frequency modulation device according to claim 1.

12. A frequency modulation method for the switching power supply of claim 11, comprising:
- generating, by a waveform generation unit, a periodic signal required for performing frequency modulation on a clock signal of the switching power supply to be controlled;
- performing, by a frequency modulation unit, voltage-current conversion and arithmetic processing based on the periodic signal to obtain a frequency modulation current required for performing the frequency modulation on the clock signal of the switching power supply to be controlled; and
- performing, by an RC oscillation unit, RC oscillation processing based on the frequency modulation current to obtain a frequency oscillation signal as the clock signal of the switching power supply to be controlled.

13. The device according to claim 1, wherein the reference module is configured to provide a fixed reference signal for comparison with the periodic signal, or to receive a set reference signal for comparison with the periodic signal.

14. The device according to claim 1, wherein the control module is configured to receive the periodic signal, and control the first current mirror and the third current mirror based on a comparison result of the periodic signal and the fixed reference signal or the set reference signal.

* * * * *